United States Patent
Chang et al.

(10) Patent No.: US 6,778,342 B1
(45) Date of Patent: Aug. 17, 2004

(54) COATED SUBSTRATES FOR RESISTING DIZZINESS, ENHANCING DISPLAYED COLOR, ELIMINATING STATIC ELECTRICITY AND BLOCKING RADIATION

(75) Inventors: Tao-Kuang Chang, Taipei Hsien (TW); Chih-Feng Chang, Taipei Hsien (TW); Chih-Jung Chang, Taipei Hsien (TW)

(73) Assignee: Chipax Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/436,280

(22) Filed: May 13, 2003

(51) Int. Cl.$^7$ ................................................ G03F 5/00
(52) U.S. Cl. ................. 359/893; 359/885; 313/112; 313/461; 313/479; 430/6; 342/832
(58) Field of Search ............................. 313/112, 110, 313/479, 461; 430/5–6; 348/832; 359/885, 893

(56) References Cited

U.S. PATENT DOCUMENTS

2002/0018886 A1 * 2/2002 Matsufuji ................ 428/328

* cited by examiner

Primary Examiner—Drew A. Dunn
Assistant Examiner—Leo Boutsikaris
(74) Attorney, Agent, or Firm—Troxell Law Office PLLC

(57) ABSTRACT

The present invention relates to a process for gratings able to resist dizziness, enhance color displayed, eliminate static electricity and block radiation. Steps included are: making a substrate with an enhanced glass or optical plastic glass or optical plastics; coating the surface of the substrate with dizziness-resistant films composed of evenly distributed nano-particles, wherein the inner layer is made of Cu particles or Al particles and the outer layer is made of Cr particles; forming a static-electricity-resistant layer on the grating's surface so as to form an optical diffraction grating able to resist dizziness, enhance color displayed, eliminate static electricity and block radiation.

3 Claims, 4 Drawing Sheets

COATED SUBSTRATES FOR RESISTING DIZZINESS, ENHANCING DISPLAYED COLOR, ELIMINATING STATIC ELECTRICITY AND BLOCKING RADIATION

FIELD OF THE INVENTION

The present invention relates to an improved process for gratings able to resist dizziness, enhance displayed color, eliminate static electricity and block radiation. Such gratings apply both to large and small TFT-LCDs or PDPs, helping them resist dizziness, enhance color displayed on the monitors, eliminate static electricity and block radiation.

BACKGROUND OF THE INVENTION

Development of technology has given an impetus to the prevalence of computers and televisions. The time that people expose to the radiation of monitors is getting longer. Having one's eyes exposed to radiation for such a long time would lead to many vision diseases, such as nearsightedness, astigmatism, cataract and serious vision impairment. Therefore, radiation-resistant monitors have become an important issue for today's monitor makers who have been trying to provide their customers with high-quality, low radiation and cost-effective monitors.

The radiation and static electricity caused by current TFT-LCDs or PDPs put the audience in danger. To protect the viewers from radiation, a grating is usually appended in front of the monitor for separation. Such gratings are usually a glass substrate plated with several films to block radiation and static electricity.

However, as the size of the monitors increase, it has become even hard to volume produce the glass substrate that eliminates static electricity and blocks radiation because the limitation of producing equipment and film processing.

Current glass substrate that eliminates static electricity and blocks radiation is made by sputtering that plates the glass substrate with several films. This method, however, limits the coating area and cannot apply to large substrates. This is because the larger area it is, the more likely the films peel off. This method usually applies to 15"–20" substrates only and would not fit those whose area is more than 30", thus restricts the volume of production. In a word, sputtering can't be used in large monitors' glass substrates that require volume production.

Moreover, when the resistivity of large PDPs' monitor achieves 300, the viewers get dizzy and vision illness. All of these are the technical bottlenecks that current monitor makers try to overcome.

Because of the inappropriate grating process for large TFT-LCDs or PDPs, the industry has been devoted to developing an alternative.

SUMMARY OF THE INVENTION

In view of such gratings that only apply to small-sized TFT-LCDs or PDPs and thus not fit for mass production, the inventor for the present invention has been devoted to developing a process for gratings able to resist dizziness, enhance displayed color, block radiation and eliminate static electricity.

The main objective for the present invention is to provide a simple process for gratings able to resist dizziness, enhance displayed color, block radiation and eliminate static electricity, which not only applies to mass production but also reduces the cost. Such gratings are suitable for large and small TFT-LCDs or PDPs.

The present invention consists of a large enhanced substrate coated with several films of nano-particles that could prevent dizziness. In this way, the surface of the substrate is able to block radiation and reduce dizziness as well as enhance the capability of light-absorption. With the static-electricity-resistant layer attached on the surface, the grating can eliminate static electricity. This layer is a conductive metal net composed of conductive nano fibers with PET or PC as the base. Therefore, the gratings coated with several dizziness-resistant films and a static-electricity-resistant layer can resist dizziness, enhance displayed color, block radiation and eliminate static electricity. With only a few of films and a static-electricity-resistant layer attached on the substrate, this grating process would apply to large substrates, making the manufacturing easier and reducing manufacturing cost, thus makes fabrication more cost-effective.

In the following, the embodiment illustrated is used to describe the detailed structural characteristics and operation action for the present invention.

DETAILED DESCRIPTION OF THE INVENTION

Figure 1:
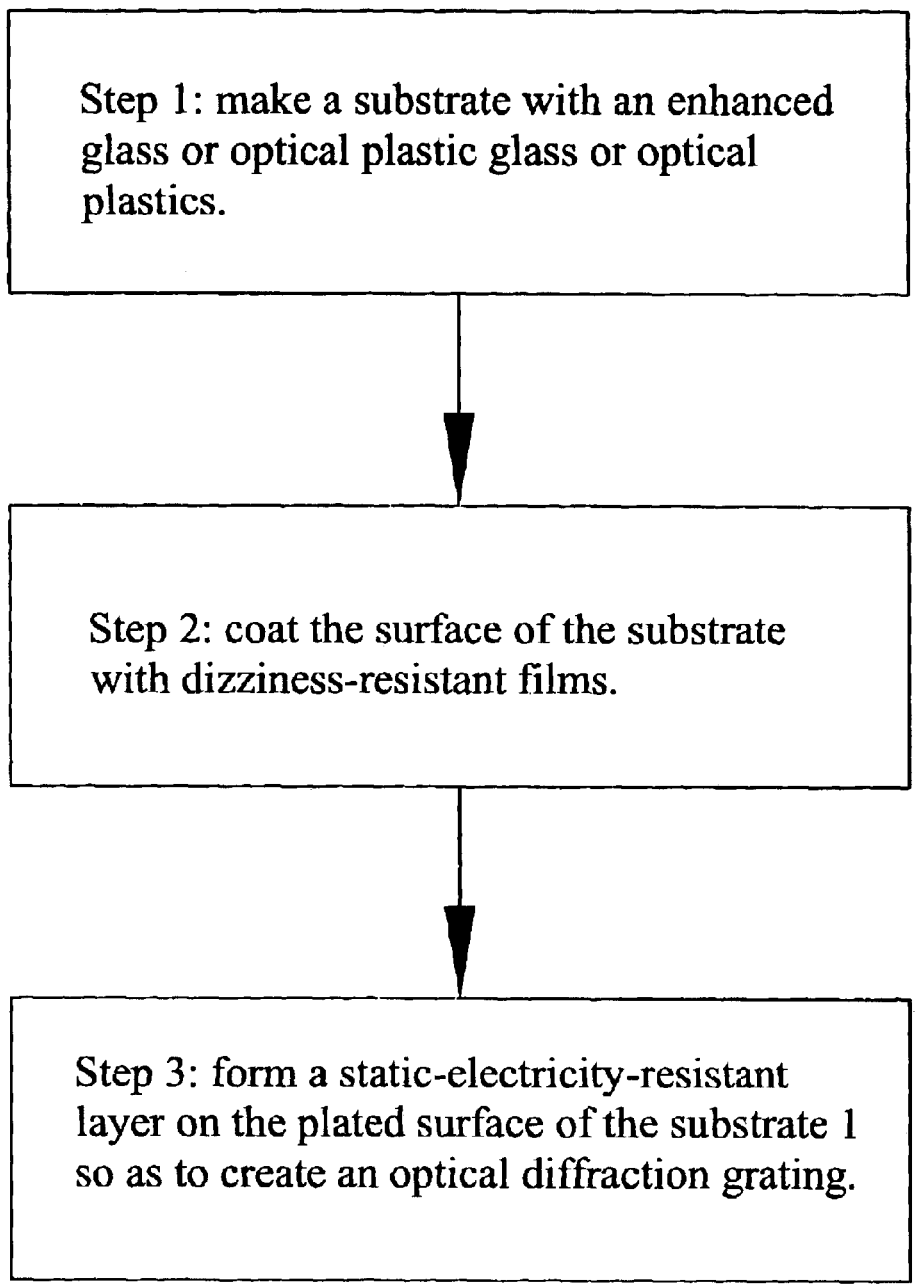
FIG. 1 is a flow chart for the fabrication of the present invention.
Figure 2:
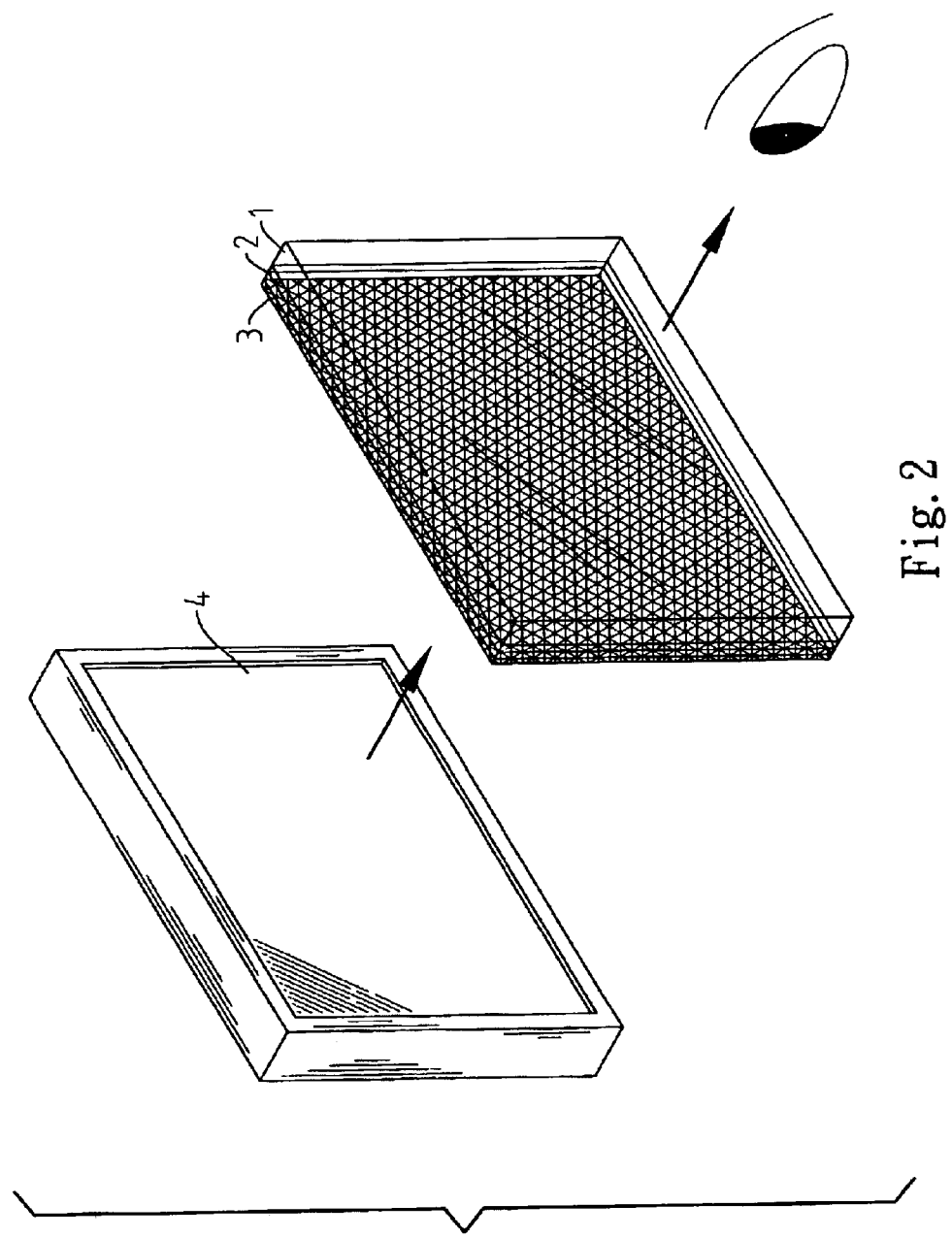
FIG. 2 is a three-dimensional illustration for the application of the present invention.
Figure 3:
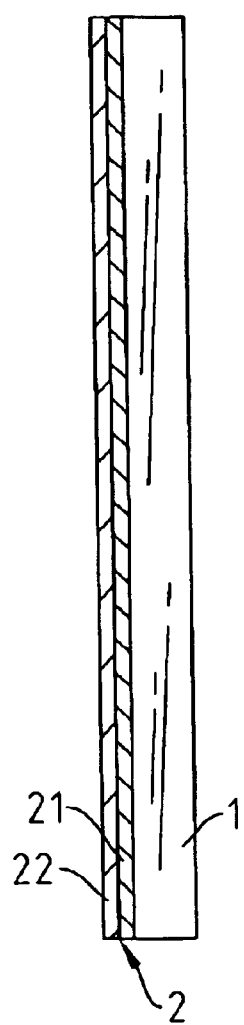
FIG. 3 is a lateral view for the dizziness-resistant substrate of the present invention.
Figure 4:
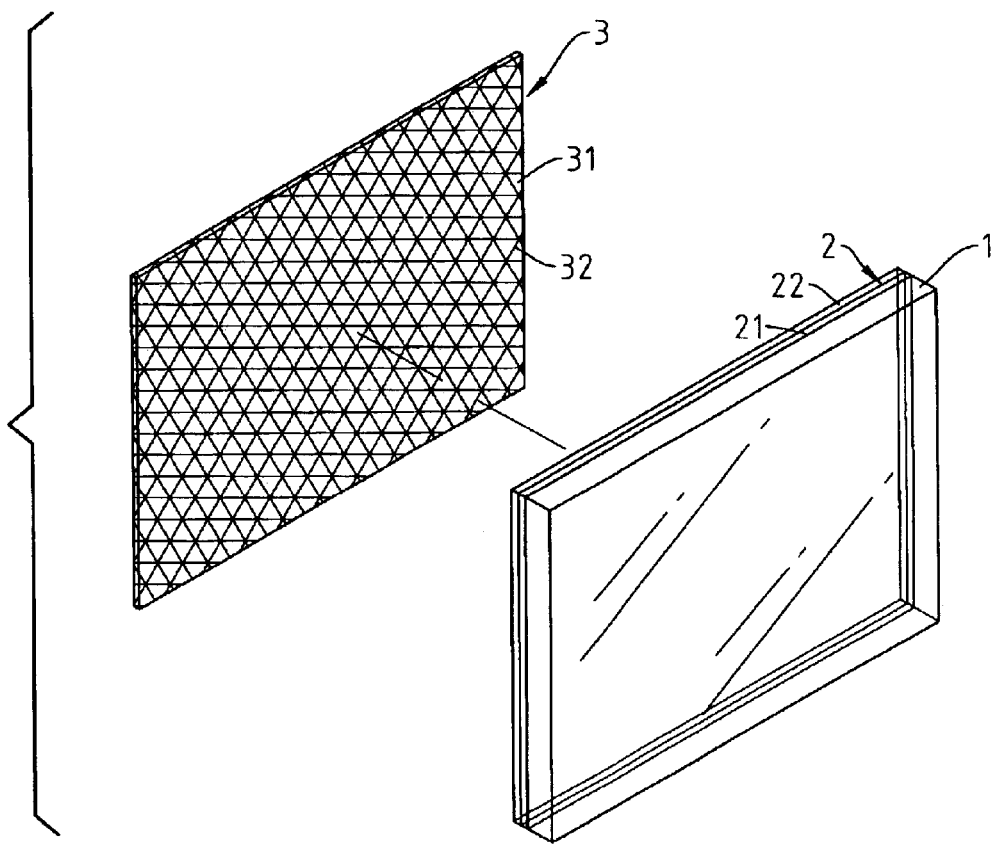
FIG. 4 is a three-dimensional illustration for deformation of the present invention.

Please refer to FIG. 1 to FIG. 4 for the process of the present invention:

Step 1: make a substrate with an enhanced glass or optical plastic glass or optical plastics.

Step 2: coat the surface of the substrate 1 with dizziness-resistant films by immersing the substrate in an electroplate trough and plate for 5–20 minutes to form several 0.1 mm–0.3 mm thick films. These films are composed of evenly distributed nano-particles. Please refer to FIG. 3. The inner layer 21 of the films is made of Cu or Al particles and the outer layer is made of Cr particles, so as to form a dizziness-resistant film 2 whose Total Light Permeation is between 87 and 90%, Diffused light Permeation is 1.45±0.2%, Haze is 1.6±3%, Gloss is 80±5 degrees and Hardness is 7H. This makes is possible to block radiation efficiently while gives the substrate 1 the ability of blocking light. The Cr particles can absorb light and enhance the color; therefore the light emitted from the monitor 4 can diffraction through the dizziness-resistant films 2, thus, resists dizziness, blocks radiation and enhances the color displayed.

Step 3: form a static-electricity-resistant layer 3 on the plated surface of the substrate 1 so as to create an optical diffraction grating. The layer 3 is a PET or PC material 31 that attaches the conductive nano fiber 32 with 66% of light transmittance and 0.14 ($\Omega$/sq) of surface resistivity to the conductive metal net of the surface (please refer to FIG. 4), so that the static electricity produced by the monitor 4 is emitted through the conductive nano fibers 32 to then be eliminated.

In a word, the grating of the present invention that resists dizziness, enhances color displayed, eliminates static electricity and blocks radiation has several dizziness-resistant films and a static-electricity-resistant layer attached, making it able to resist dizziness, enhance color displayed, eliminate static electricity and block radiation. With only a few films and the static-electricity-resistant layer attached directly onto the substrate, this manufacturing process can apply to large area substrates as well as facilitates the production, thus decreases production cost and achieve the benefits of volume production.

To summarize the above description, the grating in the present invention can provide effective performance through a simple structural improvement, which practically meets the qualifications for invention based on new type and improvement. Accordingly, an application is submitted for examination.

What is claimed is:

1. A process for creating a coated substrate for resisting dizziness, enhancing color, eliminating static electricity and blocking radiation, which comprises the steps of:

a) supplying a substrate composed of a material selected from a group consisting of enhanced glass, optical plastic glass and optical plastic;
   b) plating said substrate with dizziness-resistant films composed of evenly distributed nano-particles, having an inner layer composed of Cu or Al particles and an outer layer consisting of Cr particles; and
   c) forming a static-electricity-resistant layer on the dizziness-resistant films.

2. The process according to claim 1, wherein said dizziness-resistant films of the plating step b) are formed by immersing said substrate in an electroplate trough and plating for 5–20 minutes to form several films each with a thickness between 0.1 mm–0.3 mm.

3. The process according to claim 1, wherein said static-electricity-resistant layer of the forming step c) is a conductive metal net composed of conductive nano-fibers embedded in a base made from one of PET and PC, so as to eliminate static electricity caused by monitors.

* * * * *